United States Patent [19]

Karstensen et al.

[11] Patent Number: 4,871,224

[45] Date of Patent: Oct. 3, 1989

[54] DEVICE FOR OPTICAL CONNECTIONS OF ONE OR MORE OPTICAL EMITTERS WITH ONE OR MORE OPTICAL DETECTORS OF ONE OR MORE INTEGRATED CIRCUITS

[75] Inventors: Holger Karstensen, Munich; Ekkehard Klement, Graefelfing, both of Fed. Rep. of Germany

[73] Assignee: Siemens Aktiengesellschaft, Berlin and Munich, Fed. Rep. of Germany

[21] Appl. No.: 322,410

[22] Filed: Mar. 13, 1989

[30] Foreign Application Priority Data

Mar. 31, 1988 [DE] Fed. Rep. of Germany ....... 3811028

[51] Int. Cl.$^4$ .............................................. G02B 6/26
[52] U.S. Cl. .................................. 350/96.15; 250/227; 350/96.11
[58] Field of Search ............................. 250/205, 227; 350/96.11, 96.12, 96.15; 357/17, 19, 30

[56] References Cited

U.S. PATENT DOCUMENTS

| | | | |
|---|---|---|---|
| 4,136,928 | 1/1979 | Logan et al. | 350/96.11 |
| 4,675,518 | 6/1987 | Oimura et al. | 250/205 |
| 4,699,449 | 10/1987 | Lam et al. | 350/96.11 |

OTHER PUBLICATIONS

Hornak, "Fresnel Phase Plate Lenses for Through-Wafer Optical Interconnections", *Applied Optics*, vol. 26, No. 17, Sep. 1, 1987, pp. 3649–3654.

Feldman et al, "Computer Generated Holographic Optical Elements for Optical Interconnection of Very Large Scale Integrated Circuits", *Applied Optics*, vol. 26, No. 20, Oct. 15, 1987, pp. 4377–4384.

*Primary Examiner*—Frank Gonzalez
*Attorney, Agent, or Firm*—Hill, Van Santen, Steadman & Simpson

[57] ABSTRACT

A device for optically connecting one or several optical emitters with one or several optical detectors of integrated circuits characterized by a substrate, a spacer disposed on the substrate providing recesses for each of the integrated circuits and components and a cover plate with either a light waveguide structure extending between the various emitters and detectors interposed either between the cover plate and spacer or on one of the cover plates and spacers or a distributing element positioned on a surface of the cover plate for distributing light emitted by the optical emitter in one recess to the detectors of the same recess or both. The waveguide system allows interconnecting an optical emitter of one unit or component with a detector of another unit component or components. The distributing element allows connecting the optical emitter to the optical detector of a single unit. Thus, selection of the two types of optical arrangements allows an external connection of one component to another component or internal connections of elements of a single component.

23 Claims, 3 Drawing Sheets

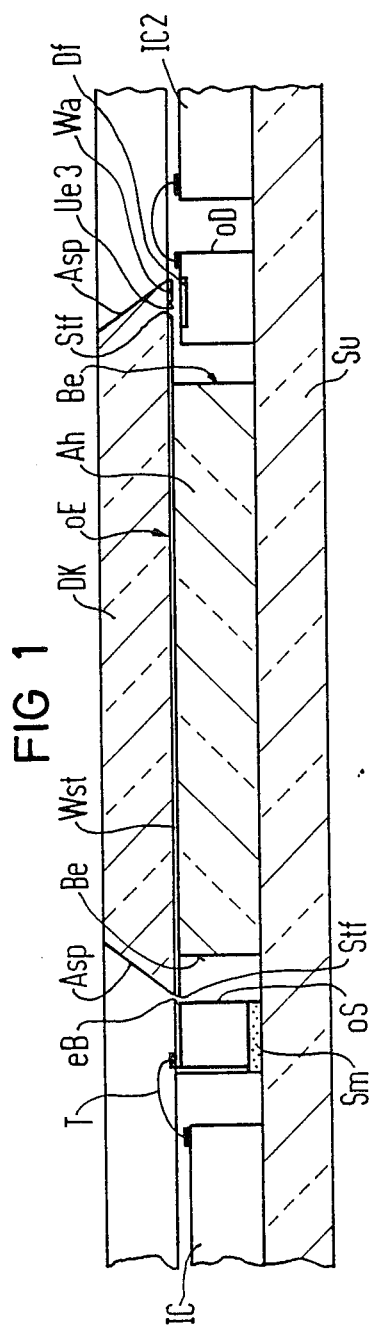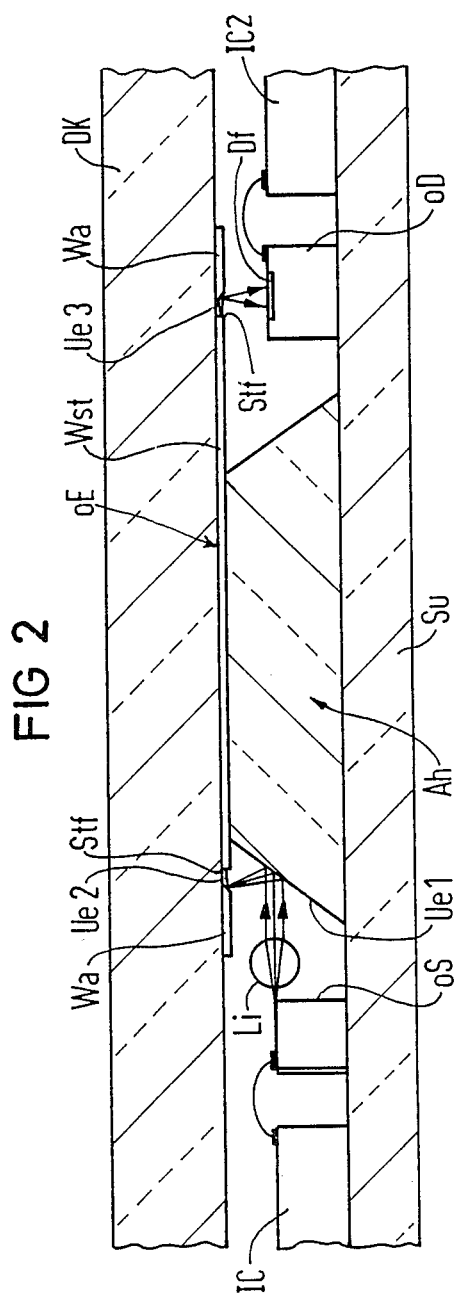

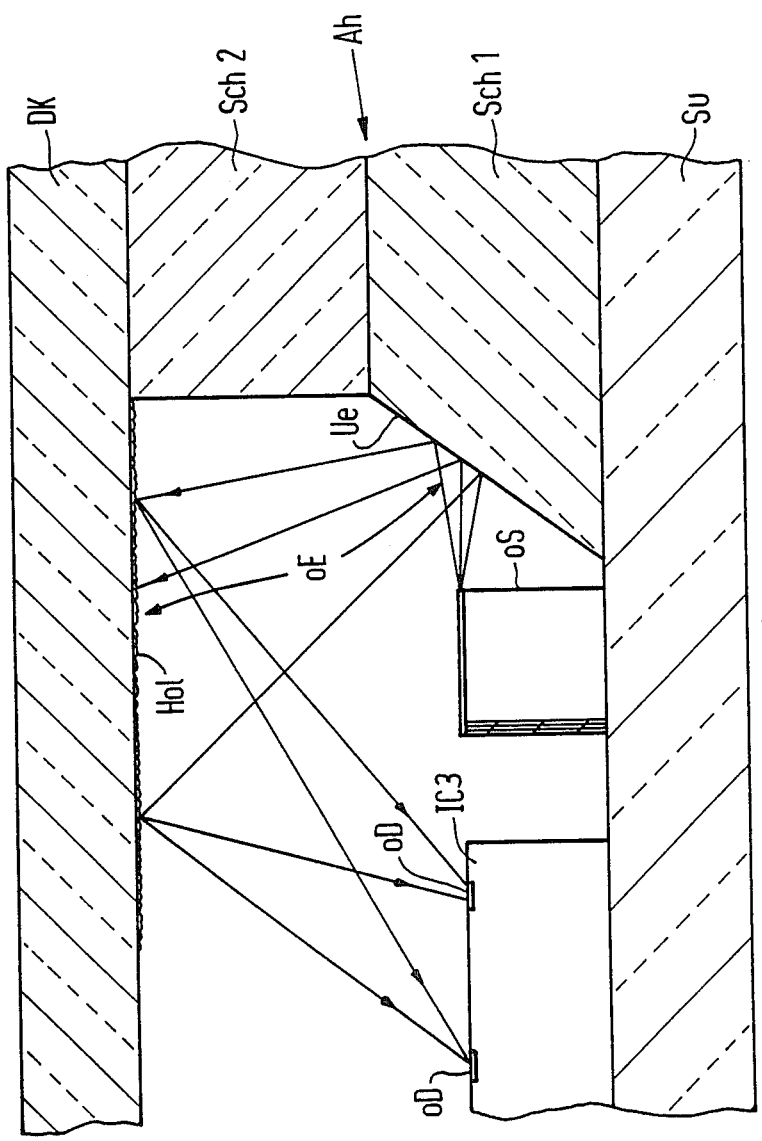

DEVICE FOR OPTICAL CONNECTIONS OF ONE OR MORE OPTICAL EMITTERS WITH ONE OR MORE OPTICAL DETECTORS OF ONE OR MORE INTEGRATED CIRCUITS

BACKGROUND OF THE INVENTION

The present invention is directed to a device for the optical connection of one or more optical emitters with one or more optical detectors of one or more integrated circuits.

A device for the optical connection of a plurality of optical emitters that are allocated to a common, integrated circuit and have a plurality of optical detectors of this circuit is known and disclosed in an article from *App. Optics*, Vol. 26, No. 20, Oct. 15, 1987, pp. 4377–4384. As disclosed, an optical installation for directing of the light emitted by an optical emitter to several optical detectors is composed of a hologram which is arranged above the emitter and the integrated circuit. The hologram is supplied with light emitted by an emitter and will distribute this supplied light to certain optical detectors on the integrated circuit. This publication contains no detailed information how the detectors, the hologram and the integrated circuits are fastened relative to one another.

A device for the optical connection of several optical emitters with several optical detectors is known from an article in *App. Optics*, Vol. 26, No. 17, Sept. 1, 1987, pp. 3649–3654. As disclosed, the optical emitters are arranged on a substrate and are covered by a transparent, layered alignment template. Between this template and a layer of silicon, a Fresnel phase plate lens is arranged as an optical device for the directing of the light emitted by an optical emitter to one or several optical detectors. This phase plate lens directs the light, which is emitted by the optical emitters and permeates both a template and the layer of silicon, to the optical detectors, which are arranged on the layer of silicon on the side of the layer which is facing away from the lens and emitters.

SUMMARY OF THE INVENTION

The object of the present invention is to create a device for the optical connection of one or more optical emitters with one or more optical detectors of one or more integrated circuits, which device requires an optimally small constructional cost and has a high precision for manufacturing external optical connections of various integrated circuits, particularly of computer chips, as well as internal optical connections in the case of individual integrated circuits, as well as such external and internal optical connections and combinations.

To accomplish these goals, the present invention is directed to a device for the connection of an optical emitter with an optical detector of an integrated circuit, said device having a common substrate, each integrated circuit, an optical emitter and optical detector being in the form of components and being secured on said substrate, a spacer being secured on said substrate and having a first surface extending away from said substrate, a cover having a second surface and being mounted on the spacer with the second surface of the cover facing the first surface of the spacer, and optical means for guiding light emitted by an optical emitter to an optical detector being attached to one of said first and second surfaces. This solution makes it possible to manufacture in a simple manner and with high precision, internal and external optical connections in or between integrated semiconductor chips with basically only three components. A particular advantage is that the external and internal optical connections can be manufactured in combination with each other.

In order for the achievement of high precision and to remain durable, it is expedient to create the substrate, the spacer and cover member of the same material or of materials which have basically the same thermal expansion coefficient. Thus, it is expedient to form these as silicon because this material is anisotropically etchable and, thus, enables a simple manufacturing of oblique side faces which are required in certain embodiments of the invention.

An expedient embodiment of the spacer of the device according to the invention, which can be manufactured in a simple manner and with a high accuracy with a standard lithographic method and can, furthermore, be universally employed, is by forming the spacer of one or more layers to overlap each other and have one or several recess regions existing to proceed across the entire thickness of the layer in which the various components, which are to be secured to the substrate, can be arranged.

An embodiment of the invention has the optical means constructed as a waveguide structure, which is arranged either on the first surface of the spacer or between the first surface and the second surface. The waveguide receives the light emitted by the emitter and couples this out to the desired detectors. This is advantageous for manufacturing external optical connections between various optical circuits, for example between computer chips, in order to enable a data exchange between these chips.

The waveguide structure can be one or more strip waveguides which may be, preferably, of glass. This is desirable, since the structure can be etched out of an easily producible glass layer in a very simple manner with the assistance of standard lithographic processes.

The coupling of optical emitters and optical detectors to the waveguide structure can be performed in different ways. These ways include either arranging the output of the emitter directly opposite an end face of the waveguide or concentrating the light from the emitter with a lens and deflecting the light by two deflection elements onto the end face of the waveguide. The optical detectors can be coupled to the ends of the waveguide either by having a detector window arranged opposite to the end face of the waveguide or by having the light exiting the waveguide being deflected by a deflecting element onto the detector of the waveguide.

If either the detector or the optical emitter are arranged for directly coupling into the end face of the waveguide, the cover member is provided with a recess which can consist of a window-like opening so that parts of the particular component can extend above the plane of the waveguide.

Preferably, the optical means supplies light emitted by at least one of the optical emitters to optical detectors that are allocated in various components with integrated circuits. In such an arrangement, the spacers are provided for a recess region for each of the components. Particular in the case of this last mentioned embodiment, it is possible to realize internal optical connections, as well, and simultaneous with external optical connections in a simple manner.

One feature of the invention is that the optical means is a light distribution element which is either fashioned or attached on a bottom surface of the cover member and this light distribution element is supplied by a light emitted by an optical emitter that is allocated to a certain component with an integrated circuit and distributes the light to optical detectors that are allocated to this certain component. Thus, both external and internal connections between and in integrated circuits are to be produced at the same time.

It is particularly advantageous when the spacer is formed of two layers with the first surface therebetween and in between these layers, the optical means is arranged on the first surface for the guidance of light emitted by the optical emitter arranged in the recess region of the spacer to an optical detector arranged in another recess region in the spacer and that the optical means includes light distributing elements which are attached in the cover plate at each recess for distributing light from the emitter of that particular recess to detectors located in that recess. Thus, both external and internal surfaces can be produced.

Other advantages and features of the invention will be readily apparent from the following description of the preferred embodiments, the drawings and claims.

BRIEF DESCRIPTION OF THE DRAWINGS

FIG. 1 is a cross sectional view of an embodiment of the device wherein two silicon chips with integrated circuits are externally connected with each other by an optical parallel connection;

FIG. 2 is a cross sectional view of a different embodiment of a device similar to the device of FIG. 1;

FIG. 3 is an enlarged partial cross sectional view of an embodiment of the device wherein the optical emitter that is allocated to a silicon chip with an integrated circuit is optimally connected with detectors of this chip so that internal optical connection is provided;

DESCRIPTION OF THE PREFERRED EMBODIMENTS

Figure 4:
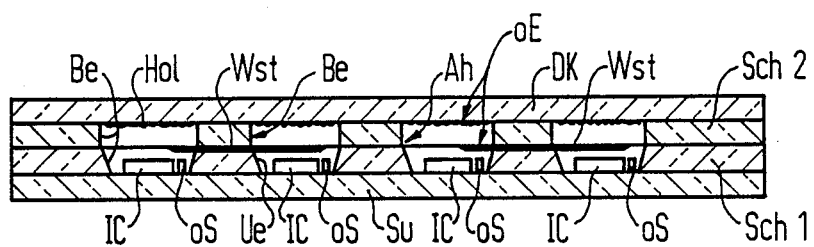
FIG. 4 is a cross sectional view through an embodiment of the device wherein silicon chips with integrated circuits are externally, optically connected and whereby each chip is internally, optically connected as well.

The principles of the present invention are particularly useful when incorporated in a device, such as illustrated in FIG. 1. The device of FIG. 1 includes a substrate Su, a spacer Ah and a cover member DK, which are all composed of a layer of silicon, whose thickness is in the range of 300 μm–1000 μm. The spacer Ah is mounted on the substrate Su and, on the left end, there is a silicon chip with an integrated circuit IC, which is secured on the substrate Su. This chip includes an optical emitter oS, which is in the form of a laser diode or array which proceeds along a line extending perpendicular to the plane of the drawing. This optical emitter oS is allocated to the integrated circuit IC. On the right end of the spacer Ah, an optical detector oD in the form of a photodetector or array that extends along the line which is perpendicular to the plane of the drawing is mounted on the substrate, and this optical detector oD is allocated to an integrated circuit IC2 arranged on this one side. The optical emitter oS is electrically connected with the allocated integrated circuit IC and is controlled by this circuit, whereas the optical detector oD is electrically connected to the integrate circuit IC2, which is allocated to it and which controls it. In FIG. 1, as in FIGS. 2, 4 and 5, the optical emitter oS and the optical oD are components that are separated from the semiconductor chip; however, they could also be integrated on the chip, as in the case of the optical detector oD on the chip IC3 of FIG. 3.

Expediently, the spacer Ah is a layer with a recess region Be in which the components are fastened on the substrate Su. For example, they can be fastened by gluing. These regions Be can be simply produced by etching.

The spacer Ah is covered by a cover member DK. Between the cover member DK and the spacer Ah is optical means for guiding light, which is illustrated in the embodiment of FIG. 1 as a waveguide structure Wst. The waveguide structure is composed of parallel strip waveguides which are, preferably, composed of glass. Each strip extends from a laser diode of the optical emitter oS to the allocated photodetector of the optical detector oD.

This waveguide structure Wst can be produced in a simple manner in that a glass layer, for example a thickness in the range of 8 μm–50 μm, is applied on the spacer Ah or onto a cover member DK and in that the desired waveguide structure Wst is etched out of this layer with the assistance of a standard photolithographic process. The glass layer can be attached, for example with the assistance of a known CVD-method. Thus, the manufacturing of the waveguide structure Wst is simple and unproblemmatic.

The in- and outcoupling of the light in and out of the waveguide structure Wst can occur in different ways. In the case of the embodiment according to FIG. 1, the optical emitter oS emits light in the plane of the strip waveguide structure Wst. The light emitting area eB of this emitter oS lies opposite an end face Stf of the waveguide of the strip waveguide structure through which the light emitted by the emitter oS is coupled into the waveguide structure Wst. In order to bring the light emitting region eB of the optical emitter oS on the level of the waveguide structure Wst, a base Sm can be used, which is dimensioned appropriately and fastened on the emitter oS. In order to make space for the part, such as T, of the optical emitter oS that lie above the light emitting region eB, i.e., for contact and electrical connections, a recess Asp is provided in the cover DK in that area of the optical emitter into which these parts T are arranged. This recess Asp can be fashioned, for example, in the form of a window in the cover member DK and can be produced by etching, for example by preferential etching of silicon. However, the recess Asp can also be provided at different locations in the cover member DK, for example, at each location at which components with integrated circuits are fastened on the substrate Su.

In the case of the embodiment according to FIG. 1, outcoupling to the optical detector oD occurs via a deflection element Ue3. This deflection element Ue3 deflects or reflects the light outcoupled at the end face Stf of the waveguide structure Wst to a detector window Df which faces the cover member DK. This deflecting element Ue3 can be composed, for example, of an oblique end face of a short waveguide section Wa, which is fastened on a bottom or second surface of the cover member DK so that the light being coupled out of the waveguide structure Wst falls onto the oblique end face.

The optical detector oD could also be arranged so that its detector window Df lies opposite the end face Stf of a waveguide of the waveguide structure Wst. The light outcoupled by this end face would be directly guided to the detector window Df. In this case, the recess Asp provided on the detector side in the embodiment according to FIG. 1 would be necessary.

If a beam deflection is used for the in- and outcoupling, the thickness of the spacer Ah can be bigger than the maximum height of the component fastened on the substrate, such as by gluing. Then recesses in the cover member DK would not be necessary in this arrangement.

FIG. 2 shows an embodiment wherein the in- and outcoupling occur by deflection. This embodiment according to FIG. 2 differs from the embodiment of FIG. 1 merely in that the incoupling of the light and the waveguide structure Wst occurs via deflection and that no recesses are provided in the cover member DK.

The light emitted by the optical emitter oS in a parallel fashion to the plane of the waveguide structure Wst diverges. This light is concentrated on one end face Stf of a waveguide of the waveguide structure Wst by a focussing and collecting lens Li and by two deflecting elements Ue1 and Ue2. In the case of the laser diode array, the lens Li, which is mounted on a base (not illustrated) is fastened on a substrate Su and can be a glass bar which is arranged to extend along a line extending perpendicular to the plane of the drawing. The first deflecting element Ue1 expediently consists of an oblique side face of the spacer Ah and deflects or reflects the light in a direction to a second or other deflecting element Ue2. The oblique side face can be produced by anisotropic etching of the silicon layer forming the spacer Ah. The other deflecting element Ue2 is formed by an oblique end face of a short waveguide section Wa, which is fastened on the bottom or second surface of the cover member DK such that the oblique end face Ue2 deflects the light striking it into the end face Stf of the waveguide of the waveguide structure Wst.

In the embodiment according to FIG. 3, the spacer Ah is formed or composed of two silicon layers Sch1 and Sch2. The bottom silicon layer Sch1 has an oblique side face forming a deflection element Ue which can be produced by anisotropic etching.

The light emitted by the optical emitter oS, which may be a laser diode, in the direction of the deflecting element Ue is deflected or reflected by this element Ue to a light distribution element Ho1, which is attached or constructed on a second surface of the cover member DK and distributes the light supplied to it to optical detectors oD, which are integrated on a semiconductor chip with an integrated circuit IC3 and these detectors are formed as photodetectors. The light distribution element can be a hologram, for example.

The embodiment according to FIG. 3 has the advantage that it is compatible with the embodiments of FIGS. 1 and 2.

Figure 5:
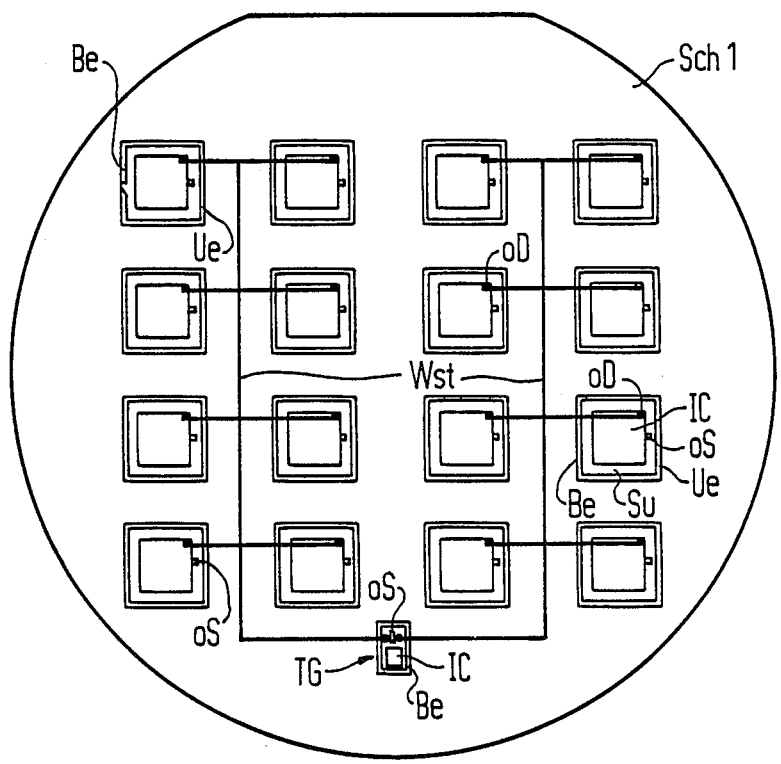
FIG. 5 is a plan view with portions removed for purposes of illustration of the arrangement of FIG. 4.

A device illustrated in FIGS. 4 and 5 shows an embodiment wherein the optical connection illustrated in FIGS. 1 and 2, as well as the optical connection according to the embodiment of FIG. 3, are realized and provided on the same substrate Su. The substrate Su is composed of a silicon wafer on which a first layer Sch1 of a spacer Ah is fastened and this layer Sch1 has a plurality of rectangular recess regions Be. In each rectangular recess region Be, a semiconductor chip with an integrated circuit IC and an optical emitter oS is arranged. On this layer Sch1, a strip waveguide structure Wst is fashioned as well. The waveguide of this structure directs light emitted by an optical emitter oS of a clock generator TG (FIG. 5) to optical detectors oD of the various integrated circuits IC.

As shown in FIG. 4, the side faces of the recess regions Be of the first layer Sch1 are oblique so that they can constitute deflecting elements Ue.

On the waveguide structure Wst, a second layer Sch2 of the spacer Ah is applied and has recess regions Be that correspond to the recess regions Be of the first layer Sch1. On the second layer Sch2, the cover member DK is applied. In the recess regions BE of the spacer Ah, a light distributing element Ho1 is attached on the bottom or second surface of the cover member DK so that an optical connection according to FIG. 3 is obtained in each of these regions.

The recess regions Be can be produced with a high degree of accuracy by etching or by anisotropic etching of silicon wafers. Since the same material is used for all of the layers, no thermal tensions or stresses will occur.

The fastening of the substrate Su, the spacer Ah and the cover DK relative to one another can occur, for example by glue or by threaded or screw connections.

Although various minor modifications may be suggested by those versed in the art, it should be understood that we wish to embody within the scope of the patent granted hereon all such modifications as reasonably and properly come within the scope of our contribution to the art.

We claim:

1. A device for optical connection of an optical emitter to an optical detector of an integrated circuit, said device comprising a substrate, each optical emitter, integrated circuit and optical detector being constructed as a component and being fastened on said substrate, a spacer being fastened on said substrate, said spacer having a first surface facing away from said substrate, a cover member having a second surface being secured to the spacer with the second surface facing toward said substrate and optical means for guiding the light emitted by an optical emitter to the optical detector, said means being attached to one of said first and second surfaces.

2. A device according to claim 1, wherein the substrate, the spacer and the cover member are composed of materials with basically the same thermal coefficient of expansion.

3. A device according to claim 1, wherein the substrate, spacer and cover member are composed of silicon.

4. A device according to claim 1, wherein the spacer has a recess region extending across its entire thickness for each component being fastened to the substrate.

5. A device according to claim 4, wherein the spacer is composed of at least two layers disposed on each other.

6. A device according to claim 1, wherein the optical means comprises a waveguide structure having at least one waveguide being disposed on the spacer having ends into which light can be coupled in and coupled out.

7. A device according to claim 6, wherein the waveguide structure is composed of several stripped waveguides.

8. A device according to claim 7, wherein the stripped waveguides are composed of glass.

9. A device according to claim 6, wherein a light emitting region of the optical member is positioned opposite an end face of the light waveguide of the light waveguide structure.

10. A device according to claim 8, wherein the waveguide structure is arranged between the spacer and the cover member and the cover member, in the area of each optical emitter, has a recess into which parts of the optical emitter lying above the height of the light emitting region can project.

11. A device according to claim 6, wherein the light emitted by the optical emitter and to be coupled into the waveguide structure is coupled by means of a lens and two deflecting elements onto the end face of the waveguide, said lens concentrating the light onto one of the deflecting elements which is attached to the spacer and which deflects the light to the other deflecting element which is attached on a second surface of the cover member and aligned with the end face of the waveguide.

12. A device according to claim 11, wherein the one deflecting element is composed of an oblique reflecting side face of the spacer.

13. A device according to claim 11, wherein the other deflecting element is composed of oblique end face of a waveguide section attached to the second surface of the cover and positioned to be aligned with the waveguide structure.

14. A device according to claim 6, wherein the detector window of an optical detector which is to receive light from an end face of the waveguide of the waveguide structure is arranged opposite the end face of the waveguide structure to receive the light coupled therefrom.

15. A device according to claim 14, wherein the waveguide structure is arranged between the spacer and the cover member, said cover member in the region of the optical detector, whose detector window is arranged opposite an end face of the waveguide structure, has a recess into which a part of the optical detector lying above the height of the detector window is projecting.

16. A device according to claim 6, wherein the light coupled out of the end face of the waveguide of the waveguide structure is directed to a detector window of an optical detector by a deflecting element.

17. A device according to claim 16, wherein the deflecting element is composed of an oblique end face of a waveguide structure attached to a second surface of the cover member and aligned with the end face of the waveguide.

18. A device according to claim 6, which has more than one integrated circuit and more than one optical detector, said optical means receiving light from at least one optical emitter and directing it to said optical detectors.

19. A device according to claim 18, wherein for each component having an integrated circuit, the spacer has a recess region for receiving the component and optical detector allocated thereto.

20. A device according to claim 1, wherein the optical means includes a light distributing element attached to said second surface of the cover member, said light distributing element receiving light emitted by the optical emitter that is allocated to a certain component of an integrated circuit, said distributing element distributing the light to the optical detectors that are allocated to said certain component.

21. A device according to claim 20, which includes an optical deflecting element for deflecting light from the optical emitter to the distribution element.

22. A device according to claim 21, wherein the deflecting element is composed of an oblique reflecting side face of the spacer.

23. A device according to claim 1, which has a plurality of integrated circuits, each integrated circuit having an optical emitter and at least one optical detector, said spacer having a recess for each of said integrated circuits, said spacer being constructed of two layers with the first surface disposed therebetween, said optical means including a waveguide system disposed on the first surface between said two layers for conducting light from one of the plurality of emitters to the optical detectors of the remaining integrated circuits, said optical means including a distributing element for each of the remaining circuits disposed on said second surface of the cover member for directing light from the optical emitter of the remaining circuits to the optical detector associated with said circuit.

* * * * *